(12) United States Patent
Liaw (10) Patent No.: US 8,737,107 B2
(45) Date of Patent: May 27, 2014

(54) MEMORY CIRCUITS AND ROUTING OF CONDUCTIVE LAYERS THEREOF

(75) Inventor: Jhon Jhy Liaw, Hsin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/638,946

(22) Filed: Dec. 15, 2009

(65) Prior Publication Data

US 2010/0177545 A1 Jul. 15, 2010

Related U.S. Application Data

(60) Provisional application No. 61/144,966, filed on Jan. 15, 2009.

(51) Int. Cl.
*G11C 5/06* (2006.01)

(52) U.S. Cl.
USPC .............................................. 365/63

(58) Field of Classification Search
USPC ................................................ 365/63
See application file for complete search history.

(56) References Cited

U.S. PATENT DOCUMENTS

| | | | |
|---|---|---|---|
| 7,269,056 B1* | 9/2007 | Liaw | 365/154 |
| 2007/0025132 A1* | 2/2007 | Liaw | 365/63 |
| 2007/0235765 A1* | 10/2007 | Liaw | 257/207 |
| 2007/0263428 A1* | 11/2007 | Ishii | 365/154 |
| 2008/0019171 A1* | 1/2008 | Liaw | 365/174 |

FOREIGN PATENT DOCUMENTS

| | | |
|---|---|---|
| CN | 1467745 | 1/2004 |
| CN | 101047186 | 10/2007 |
| JP | 2002237539 | 8/2002 |
| JP | 2004311610 | 11/2004 |

OTHER PUBLICATIONS

Notice of Reason for Rejection dated May 22, 2013 with English translation from corresponding application No. JP2010-006986.
Office Action dated Nov. 6, 2012 from corresponding application No. JP2010-006986.
Office Action dated Jan. 5, 2013 from corresponding application No. CN201010002963.7.
Office Action dated Mar. 9, 2012 from corresponding application No. CN 201010002963.7.

* cited by examiner

*Primary Examiner* — Anthan Tran
(74) *Attorney, Agent, or Firm* — Lowe Hauptman & Ham, LLP (57) ABSTRACT

A memory circuit includes at least one memory cell for storing a datum. The memory cell is coupled with a word line, a bit line, a bit line bar, a first voltage line, and a second voltage line. The memory circuit includes a first conductive layer, a second conductive layer coupled with the first conductive layer, a third conductive layer coupled with the second conductive layer. The third conductive layer is routed for the word line and is free from including the bit line, the bit line bar, the first voltage line, and the second voltage line within the memory cell.

20 Claims, 8 Drawing Sheets

MEMORY CIRCUITS AND ROUTING OF CONDUCTIVE LAYERS THEREOF

RELATED APPLICATIONS

The present application is based on, and claims priority from, U.S. Provisional No. 61/144,966 filed Jan. 15, 2009, the disclosure of which is hereby incorporated by reference herein in its entirety

TECHNICAL FIELD

The present disclosure relates generally to the field of semiconductor circuits, and more particularly, to memory circuits and routing of conductive layers thereof.

BACKGROUND

Memory circuits have been used in various applications. Memory circuits can include DRAM, SRAM, and non-volatile memory circuits. A SRAM circuit includes a plurality of memory cells. For a 6-T static memory in which arrays of memory cells are provided, each of the memory cells consists of six transistors. The 6-T SRAM memory cell is coupled with a bit line BL, a bit line bar BLB, and a word line. Four of the six transistors form two cross-coupled inverters for storing a datum representing "0" or "1". The remaining two transistors serve as access transistors to control the access of the datum stored within the memory cell.

SUMMARY

In one embodiment, a memory circuit includes at least one memory cell for storing a datum. The memory cell is coupled with a word line, a bit line, a bit line bar, a first voltage line, and a second voltage line. The memory circuit includes a first conductive layer, a second conductive layer coupled with the first conductive layer, a third conductive layer coupled with the second conductive layer. The third conductive layer is routed for the word line and is free from including the bit line, the bit line bar, the first voltage line, and the second voltage line within the memory cell.

In another embodiment, a memory circuit includes at least one memory cell for storing a datum. The memory cell is coupled with a word line, a bit line, a bit line bar, a first voltage line, and a second voltage line.

The memory circuit includes a first metal layer, a second metal layer electrically coupled with the first metal layer, a third metal layer electrically coupled with the second metal layer. The second metal layer is routed for the first voltage line and the second voltage line and the third metal layer is routed for the word line within the memory cell, wherein the second metal layer is below the third metal layer.

In a further embodiment, a memory circuit includes at least one memory cell for storing a datum. The memory cell is coupled with a word line, a bit line, a bit line bar, a first voltage line, and a second voltage line. The memory circuit includes a first metal layer defining electrical connections within the memory cell, a second metal layer electrically coupled with the first metal layer, a third metal layer electrically coupled with the second metal layer. The third metal layer routed for the word line within the memory cell has a width of about 50% or more of a width of a short side of the memory cell.

These and other embodiments, as well as their features are described in more detail below with reference to the attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

A 6-T SRAM memory cell, as discussed above, is also coupled with a power source Vdd and another power source Vss. The 6-T SRAM memory cell has a plurality of metal layers. A metal 3 (M3) layer of the 6-T SRAM memory cell is used for the word line WL and a local voltage line within the memory cell. The word line WL and the local voltage line are parallel to each other. A metal 4 (M4) layer over the M3 layer is routed for a voltage line that is configured to couple the local voltage line with the power source Vss. The metal 4 layer for the voltage line is orthogonal to the word line WL and the local voltage line.

It is found that the routing using the M3 layer for the word line WL and the local voltage line results in the width of the word line WL not being able to be desirably extended. The situation becomes even worse if a thin style SRAM memory cell is used. The thin style SRAM memory cell has a ratio of its length to width of about 2.5 or more. The high ratio of length/width results in a narrow word line routing. The narrow word line increases the resistance of the word line that adversely affects an RC time delay of signals passing through the thin word line coupled with 128, 256 or more memory cells. Additionally, the M4 layer is used for the voltage line to pick up the local voltage line. A portion of the area of the M4 layer is consumed by routing for the voltage line.

Based on the foregoing, routing of bit lines, voltage lines, and word lines of memory circuits thereof are desired.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or dispositions discussed.

Figure 1:
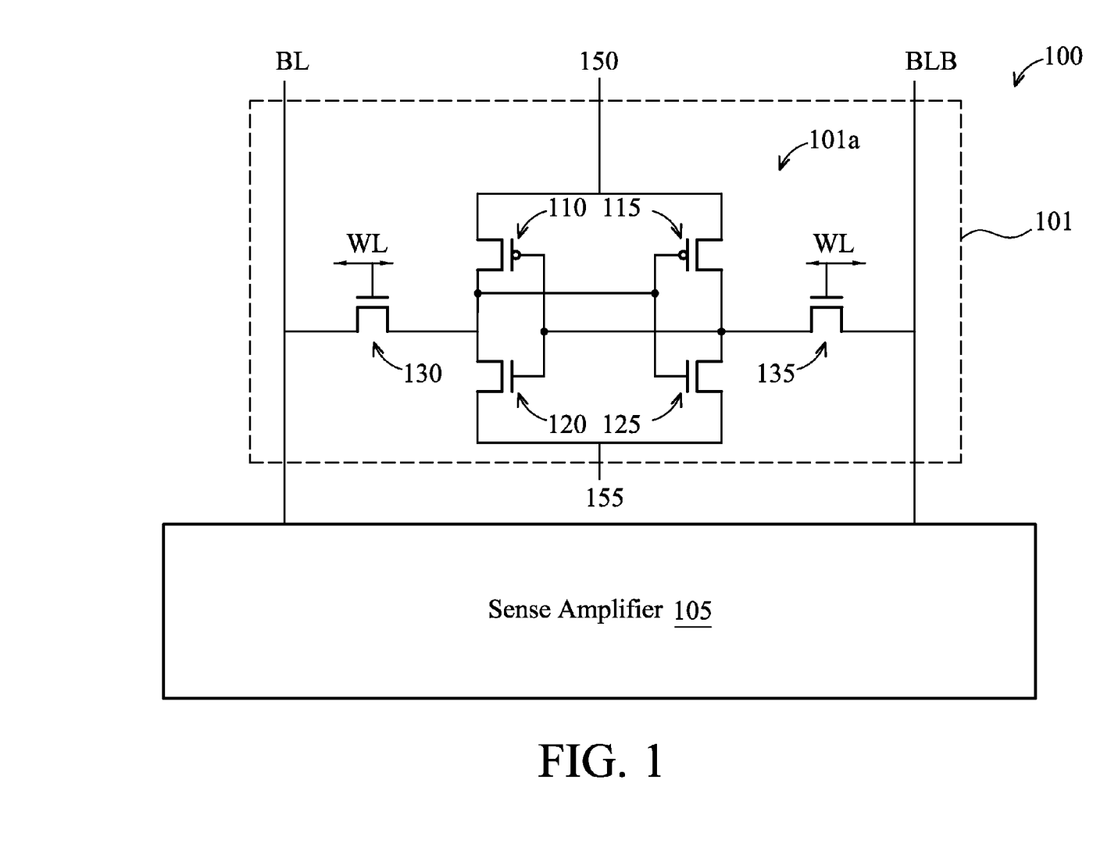
FIG. 1 is a schematic drawing illustrating an exemplary memory circuit.

FIG. 1 is a schematic drawing illustrating an exemplary memory circuit. In FIG. 1, a memory circuit 100 can include a memory array 101 including a plurality of word lines WLs and a plurality of bit lines BLs and BLBs. The memory array 101 can be coupled with a sense amplifier 105. The memory circuit 100 can be a static random access memory (SRAM) circuit, an embedded SRAM circuit, dynamic random access memory (DRAM) circuit, an embedded DRAM circuit, a non-volatile memory, e.g., FLASH, EPROM, E$^2$PROME, or other memory circuits. The memory array 101 can include at least one memory cell 101a. The memory cell 101a can be coupled with a bit line BL, a bit line bar BLB, a word line WL, a first voltage line 150 coupled with a power source, e.g., Vdd, and a second voltage line 155 coupled with another power source, e.g., Vss, of the memory array 101. The sense amplifier 105 is capable of sensing a voltage difference between the bit line BL and the bit line bar BLB to output a signal representing the datum stored in the memory cell 101a. For embodiments using a 6-T SRAM cell, the memory cell 101a can include transistors 110, 115, 120, 125, 130, and 135.

It is noted that though only one memory cell 101a is depicted, other memory cells (not shown) can be coupled with the plurality of word lines and bit lines of the memory circuit 100. A portion of a memory circuit 100 may have 8, 16, 32, 64, 128 or more columns that can be arranged in word widths. In one or more embodiments, the word lines can be laid out substantially orthogonally to the bit lines. In other embodiments, other arrangements of the word lines and bit lines can be provided.

Referring again to FIG. 1, the memory cell 101a can include the transistors 110, 115, 120, 125, 130, and 135. In one or more embodiments, the transistors 110, 120 and 115, 125 are configurable as two cross-latch inverters forming a flip-flop for storing the datum. The transistors 130 and 135 are operable as two pass transistors, access transistors or pass gates. In one or more embodiments, the transistors 110 and 115 can be referred to as pull-up transistors and the transistors 120 and 125 can be referred to as pull-down transistors. The pull-up transistors can be configured to pull a potential towards the power source $V_{dd}$ coupled with the first voltage line 150. The pull-down transistors can be configured to pull a potential towards the power source $V_{ss}$ coupled with the second voltage line 155.

In one or more embodiments, the source ends of the transistors 110 and 115 can be electrically coupled with the first voltage line 150 coupled with the power source $V_{dd}$. A drain of the transistor 110 can be electrically coupled with a source of the transistor 130, a drain of the transistor 120, and a gate of the transistor 115. A drain of the transistor 115 can be electrically coupled with a source of the transistor 135, a drain of the transistor 125, and a gate of the transistor 110. The sources of the transistors 120 and 125 can be electrically coupled with the second voltage line 155 coupled with the power source $V_{ss}$, e.g., ground, common or a voltage state that is lower than the power source $V_{dd}$. The gates of the transistor 110 and transistor 120 and the gates of the transistor 115 and the transistor 125 respectively can be electrically coupled.

Drains of the transistors 130, 135 can be electrically coupled with the bit line BL and bit line bar BLB, respectively. The gates of the transistors 130, 135 can be electrically coupled with the word line WL. The bit lines BL, BLB and the word line WL may extend to other memory cells of the memory array 101. It is noted that the number, type, and disposition of the transistors 110, 115, 120, 125, 130, and 135 are mere examples. One of ordinary skill in the art would be able to modify the number, type, and disposition of the transistors to achieve a desired memory cell.

Figure 2:
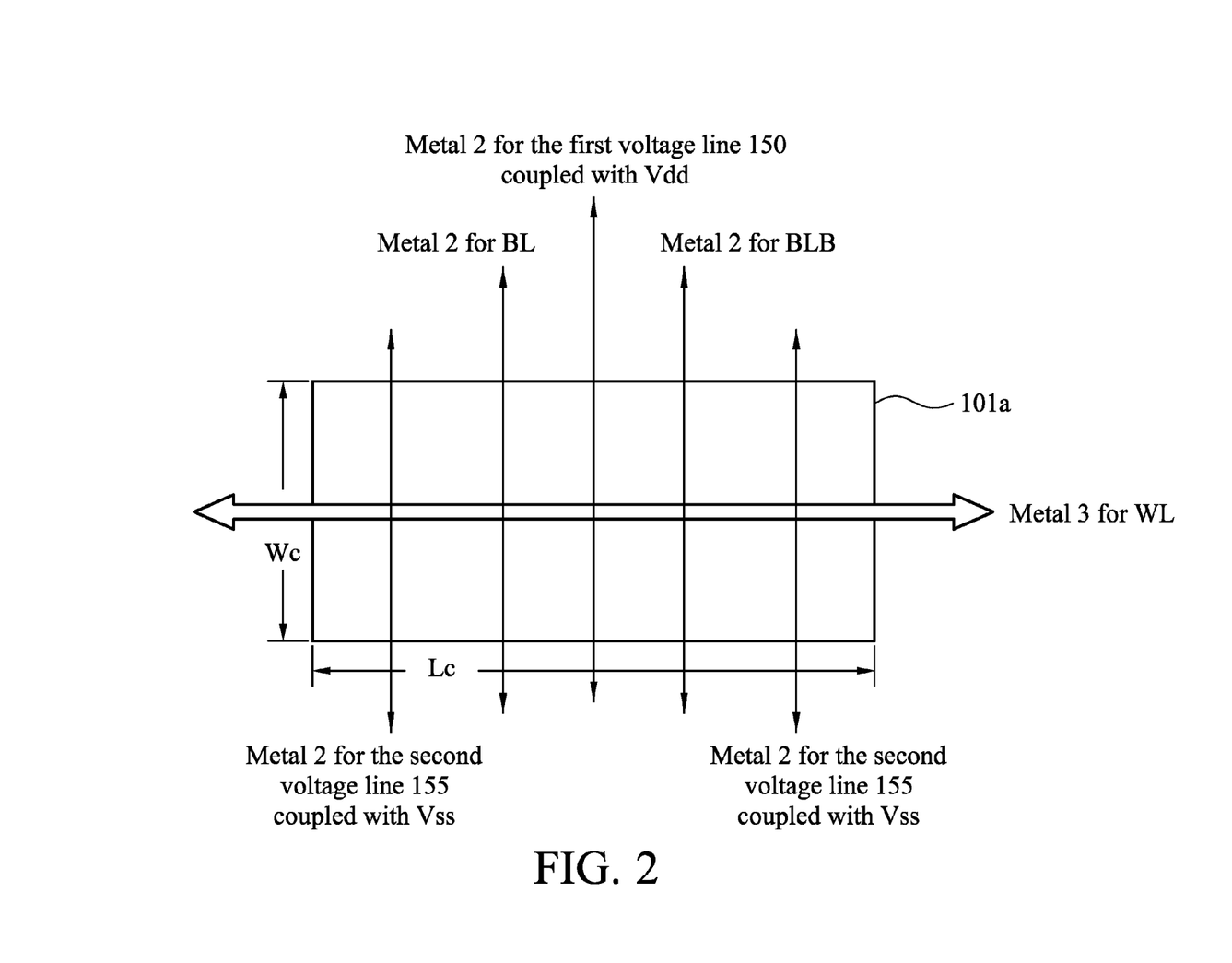
FIG. 2 is a schematic drawing showing running directions of bit lines, voltage lines, and word line within an exemplary memory cell.

FIG. 2 is a schematic drawing showing running directions of bit lines, voltage lines, and word line within an exemplary memory cell. As noted, the memory circuit 100 (shown in FIG. 1) can include a plurality of conductive layers, e.g., metal layers routed for the bit lines BL, BLB, voltage lines 150, 155, and the word line WL. For example, the plurality of the metal layers can include a metal 1 (M1) layer, a metal 2 (M2) layer, and a metal 3 (M3) layer, which are sequentially formed within a multiple layer interconnect structure. The M3 layer can be over the M2 layer, which can be over the M1 layer. In FIG. 2, the M2 layer can be routed for the bit lines BL, BLB and voltage lines 150, 155. The M3 layer can be routed for the word line WL. Within the memory cell 101a, the M3 layer is free from being routed for the bit lines BL, BLB and voltage lines 150, 155. In one or more embodiments, the M3 layer routed for the word line WL can be substantially orthogonal to the M2 layer routed for the bit lines BL, BLB, the first voltage line 150, and the second voltage line 155 within the memory cell 101a. In one or more embodiments, the memory cell 101a can have a long side having a length Lc and a short side having a width Wc. A ratio of Lc/Wc can be about 2.5 or more. In other embodiments, the ratio can be about 3 or more. In other embodiments, within the memory cell 101a a ratio of the length of the word line to the length of the bit line BL can be about 2.5 or more. In still other embodiments, the ratio can be about 3 or more.

In one or more embodiments, within the memory cell 101a, the M2 layer routed for the bit line BL can be disposed between the first voltage line 150 and the second voltage line 155 of the M2 layer. The M2 layer routed for the bit line bar BLB can be disposed between the first voltage line 150 and the second voltage line 155 of the M2 layer. In other embodiments, the M2 layer routed for the second voltage line 155 can be disposed between the first voltage line 150 and the bit line BL of the M2 layer. The M2 layer routed for the second voltage line 155 can be disposed between the first voltage line 150 and the bit line bar BLB of the M2 layer. It is found that the bit line BL and the bit line bar BLB can be desirably shielded by the first voltage line 150 and/or the second voltage line 155. The voltages on the bit line BL and the bit line bar BLB can be desirably prevented from being disturbed by accesses of other ports.

Figure 3:
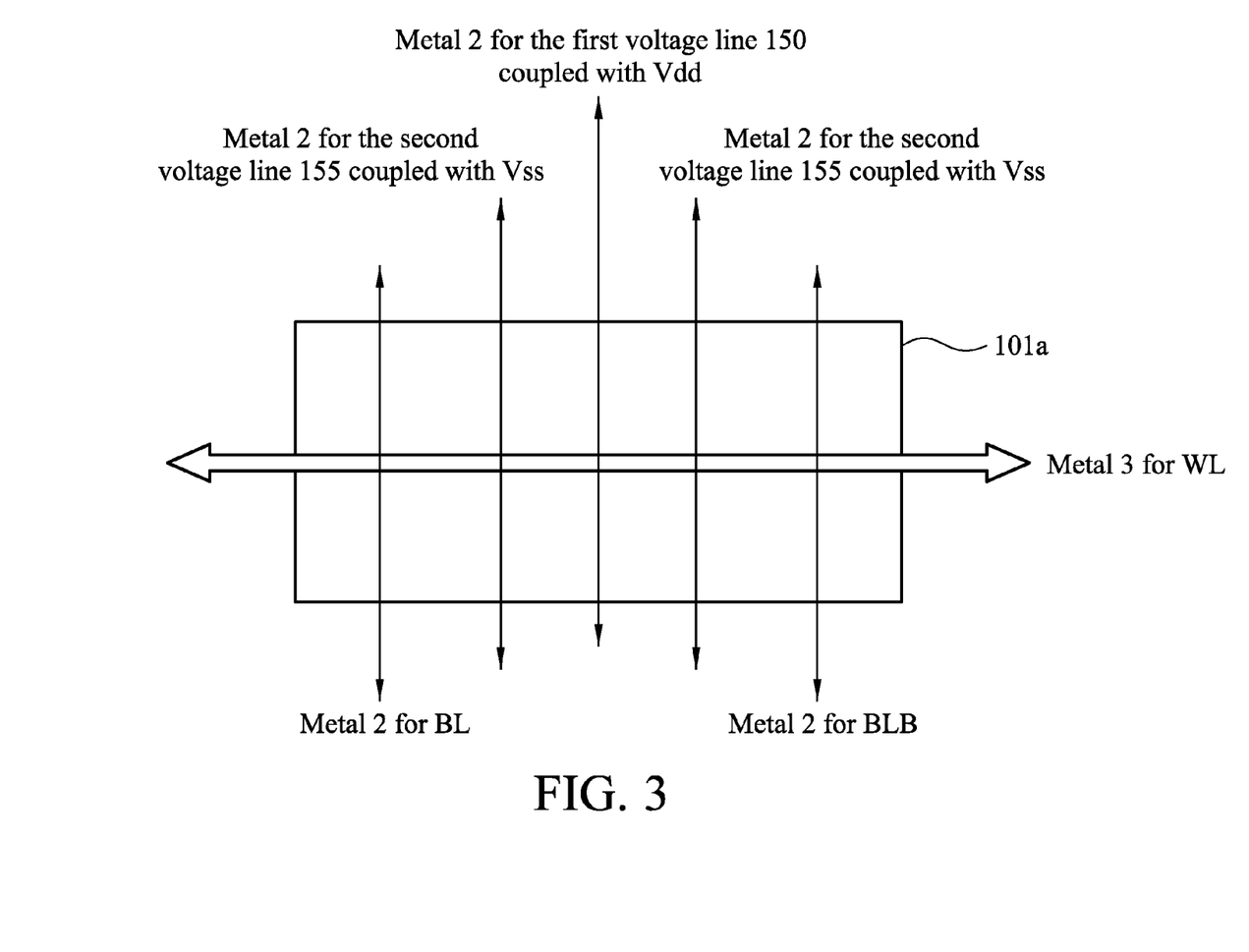
FIG. 3 is a schematic drawing showing running directions of bit lines, voltage lines, and word line within another exemplary memory cell.

FIG. 3 is a schematic drawing showing running directions of bit lines, voltage lines, and word line within another exemplary memory cell. In FIG. 3, the M1 layer can be routed for the bit lines BL and BLB. The M2 layer can be routed for the voltage lines 150 and 155. The M3 layer can be routed for the word line WL. Within the memory cell 101a, the M3 layer is free from being routed for the bit lines BL, BLB and voltage lines 150, 155.

In one or more embodiments, within the memory cell 101a, the M2 layer routed for the second voltage line 155 can be disposed between the first voltage line 150 of the M2 layer and the bit line BL of the M1 layer. The M2 layer routed for the second voltage line 155 can be disposed between the first voltage line 150 of the M2 layer and the bit line bar BLB of the M1 layer. As noted, the M3 layer routed for the word line WL can be substantially orthogonal to the M1 layer routed for the bit lines BL, BLB and the M2 layer routed for the voltage lines 150, 155.

As noted, the second voltage line 155 coupled with the power source Vss can be routed by using the M2 layer. In contrast to the discussed routing using a metal 4 (M4) layer for a voltage line to couple a local voltage line with the power source Vss, the routing of the second voltage line 155 can save the portion of the M4 layer routed for the voltage line. It is found that since the M1 layer is used to route the bit lines BL and BLB, the dimensions of the voltage lines 150 and 155 routed by using the M2 layer can be more flexible. It is noted that the number and/or sequence of the metal layers routed for the bit lines, voltage lines, and/or word line can be exchangeable. One of ordinary skill in the art can modify the routing of the metal layers to achieve a desired memory circuit. It is also noted that the number of the metal layers is not limited to the description in conjunction with FIGS. 2 and 3.

Figure 4A:
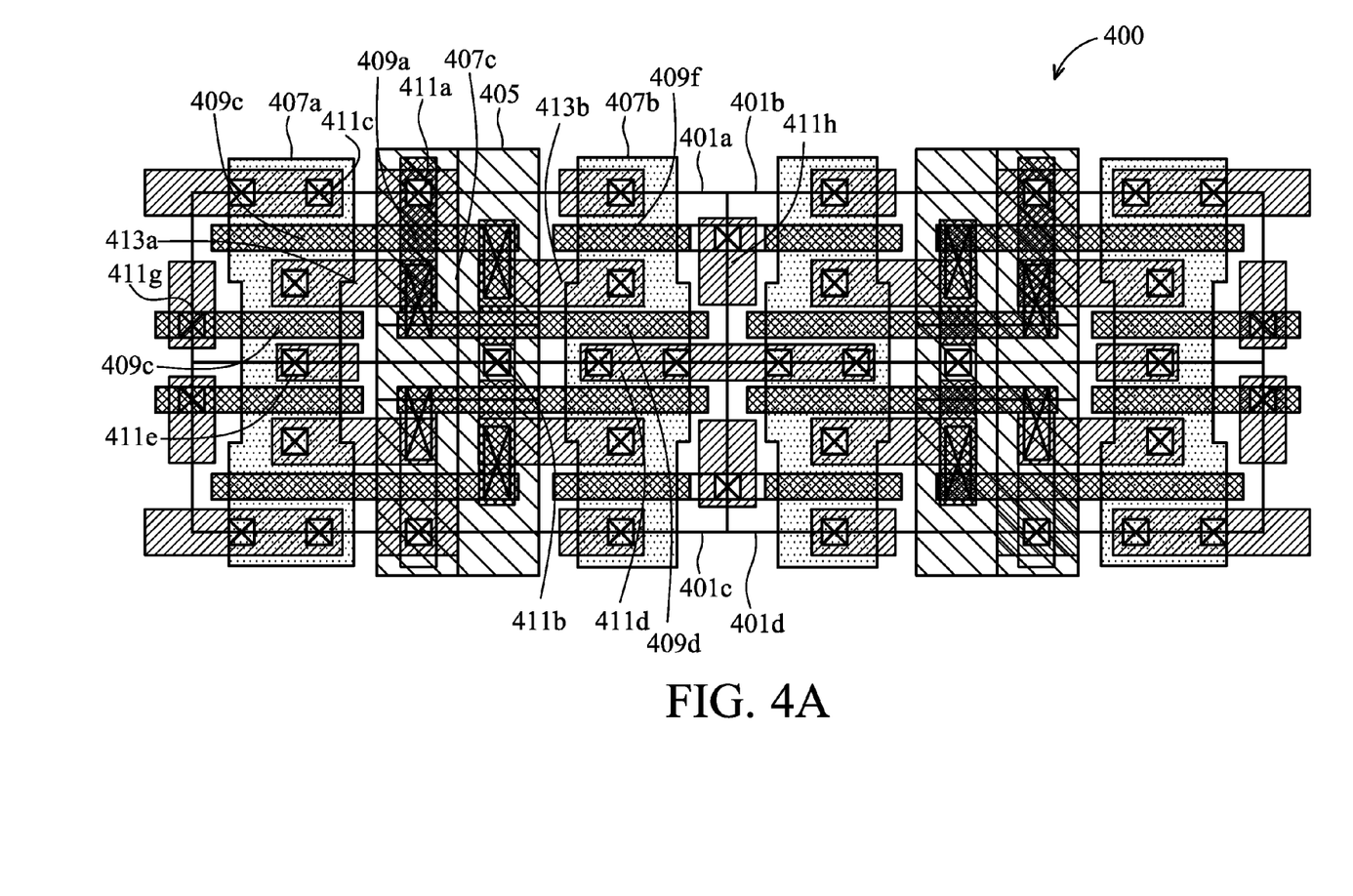
FIG. 4A is a schematic drawing showing a layout including a well layer, an oxide definition (OD) layer, a poly layer, a contact layer, and a metal 1 (M1) layer of a portion of an exemplary memory circuit.

FIG. 4A is a schematic drawing showing a layout including a well layer, an oxide definition (OD) layer, a poly layer, a contact layer, and a first conductive layer, e.g., a metal 1 (M1) layer of a portion of an exemplary memory circuit. In FIG. 4A, a portion of a memory circuit 400 can include memory cells 401a-401d. The memory circuit 400 and each of the memory cells 401a-401d can be similar to the memory circuit 100 and the memory cell 101a, respectively, described above in conjunction with FIGS. 1-3.

Each of the memory cells 401a-401d can include a well region 405, e.g., N-well region. The well region 405 can be substantially parallel to the short side of the memory cell 401a. OD regions 407a-407c can be routed within the memory cell 401a. Poly regions 409a-409f can serve as gate nodes of the transistors 110, 115, 120, 125, 130, and 135 (shown in FIG. 1), respectively.

A contact 411a can couple the source node of the transistor 110 with the power source $V_{dd}$. A node 413a of the M1 layer can couple the drain node of the transistor 110 with the source node of the transistor 130, the drain node of the transistor 120, and the gate node of the transistor 115. Similarly, a contact 411b can couple the source node of the transistor 115 with the power source $V_{dd}$. A node 413b of the M1 layer can couple the drain node of the transistor 115 with the source node of the transistor 135, the drain node of the transistor 125, and the gate node of the transistor 110. Contacts 411c and 411d can couple the source nodes of the transistors 120 and 125, respectively, with the power source Vss. Contacts 411e and 411f can couple the bit line BL and bit line bar BLB with the drain nodes of the transistors 130 and 135, respectively. Contacts 411g and 411h can couple the gate nodes of the transistors 130 and 135, respectively, with the word line WL. It is noted that the well layer, oxide definition (OD) layer, poly layer, contact layer, and metal 1 (M1) layer described above are mere examples. The memory circuit 400 can include more layers such as P-well layer or other semiconductor layer. Other arrangements are within the scope of this disclosure.

Figure 4B:
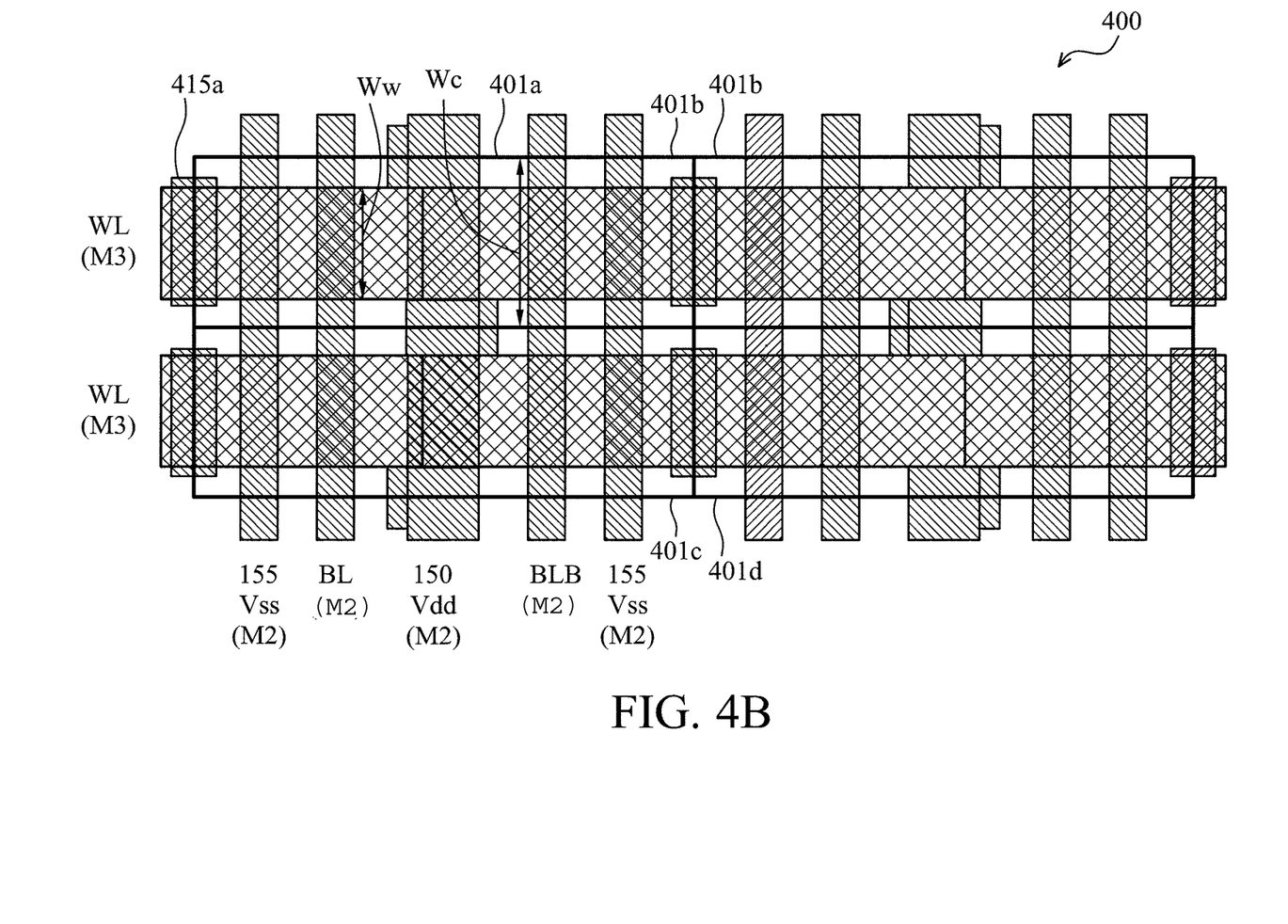
FIG. 4B is a schematic drawing showing a layout including a metal 2 (M2) layer, a via 2 layer, and a metal 3 (M3) layer over the layout show in FIG. 4A.

FIG. 4B is a schematic drawing showing a layout including a second conductive layer, e.g., a metal 2 (M2) layer, a via 2 layer, and a third conductive layer, e.g., a metal 3 (M3) layer, over the layout show in FIG. 4A. In FIG. 4B, the M2 layer can be routed for the bit lines BL, BLB, and the voltage lines 150, 155. The M3 can be routed for the word line WL. In one or more embodiments, the M3 layer for the word line WL can have a width Ww of about 50% or more of the width Wc of the short side of the memory cell 401a. In one or more embodiments, the M2 layer can include landing pads 415a and 415b coupled with vias 2 (not labeled) through which the M2 layer can be coupled with the M3 layer.

It is found that within the memory cell 401a the M3 layer is substantially routed for the word line WL. The width of the word line WL can be desirably extended. By increasing the width of the word line WL, the resistance of the word line WL can decline. Due to the reduction of the resistance of the word line WL, an RC time delay of signals passing through the word line WL can be desirably reduced. The reduction of RC time delay can be substantially achieved if the word line WL is coupled with a great number memory cells, e.g., 128, 256, or more memory cells. Accordingly, the speed of the memory circuit 400 can be desirably enhanced. It is noted that the memory cell 401a can include additional metal layers and/or dielectric layers over the M3 layer. It is also noted that the layer number and number of layers of the metals and vias described above are mere examples. One of ordinary skill in the art can modify them to achieve a desired routing of the memory circuit.

Figure 5A:
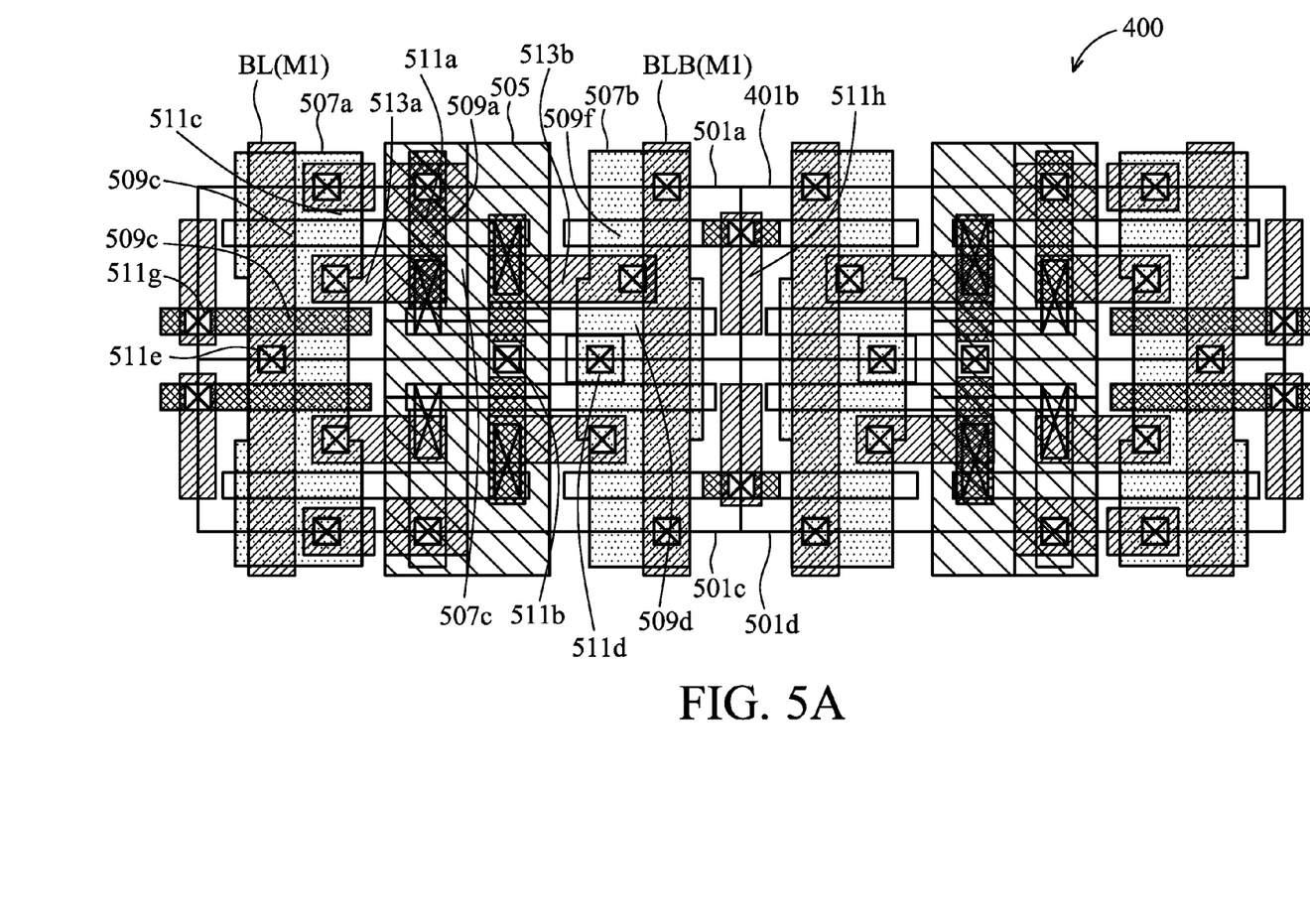
FIG. 5A is a schematic drawing showing another layout including a well layer, an oxide definition (OD) layer, a poly layer, a contact layer, and a metal 1 (M1) layer of a portion of an exemplary memory circuit.

FIG. 5A is a schematic drawing showing another layout including a well layer, an oxide definition (OD) layer, a poly layer, a contact layer, and a first conductive layer, e.g., a metal 1 (M1) layer of a portion of an exemplary memory circuit. The elements indicated by the reference numerals in FIG. 5A are similar to those of the reference numerals shown in FIG. 4A increased by 100. In FIG. 5A, the M1 layer can be routed for the bit line BL and bit line bar BLB. The M1 layer routed for the bit line BL and bit line bar BLB can be disposed adjacent to landing pads 521a and 521b of the M1 layer, respectively. In one or more embodiments, the M1 layer routed for the bit line BL can be between the M1 layer for the landing pad 521a and the node 513a. The M1 layer routed for the bit line bar BLB can be between the landing pad 521b and the node 513a of the M1 layer.

Figure 5B:
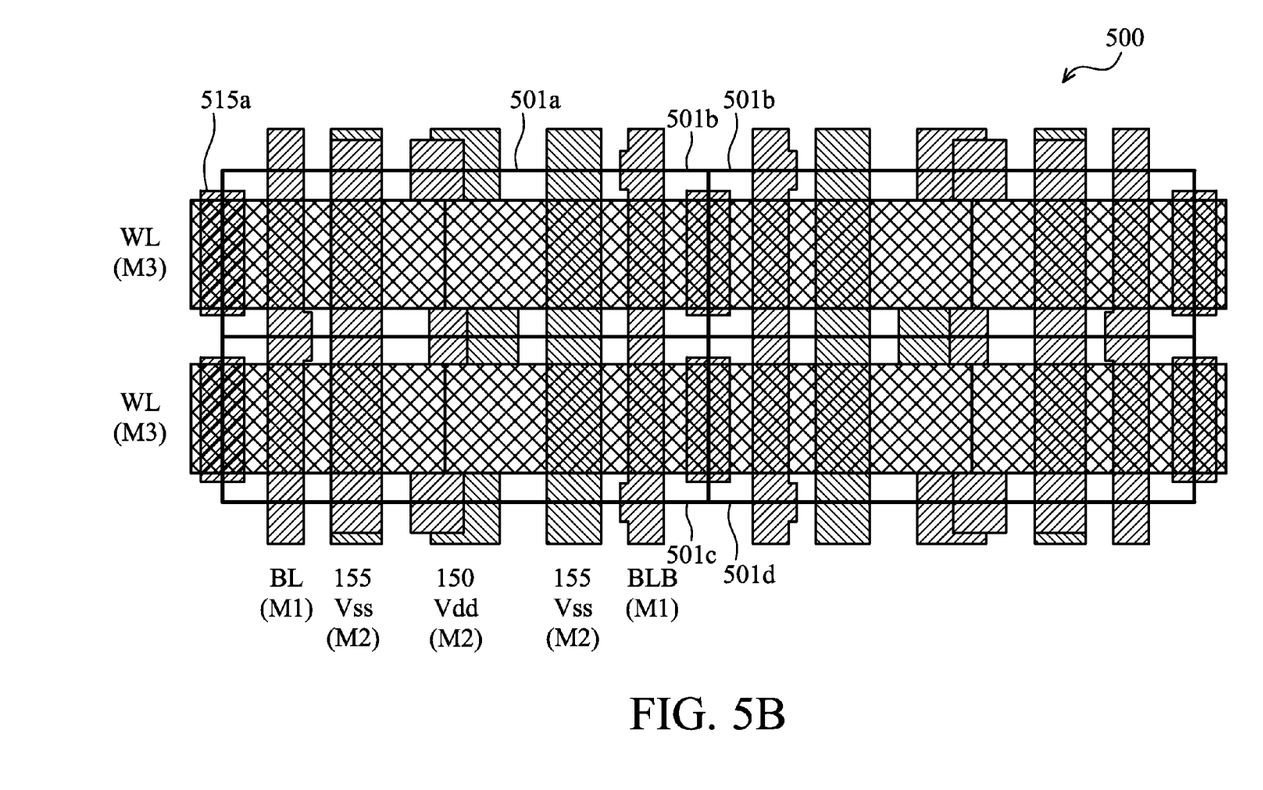
FIG. 5B is a schematic drawing showing another layout including a metal 1 (M1) layer, a via 1 layer, a metal 2 (M2) layer, a via 2 layer, and a metal 3 (M3) layer.

FIG. 5B is a schematic drawing showing another layout including a metal 1 (M1) layer, a via 1 layer, a second conductive layer, e.g., a metal 2 (M2) layer, a via 2 layer, and a third conductive layer, e.g., a metal 3 (M3) layer. In FIG. 5B, the M1 layer can be routed for the bit lines BL and BLB. The M2 layer can be routed for the voltage lines 150 and 155. The M3 can be routed for the word lines WL. In one or more embodiments, the M3 layer for the word line WL can have a width Ww of about 50% or more of the width Wc of the short side of the memory cell 501a. In one or more embodiments, the M2 layer can include landing pads 515a and 515b coupled with vias 2 (not labeled) through which the M2 layer can be coupled with the M3 layer.

It is found that the bit line BL and the bit line bar BLB within the memory cell 501a are routed by using the M1 layer. The disposition of the bit line BL and the bit line bar BLB within the M1 layer can desirably reduce coupling capacitances of the bit lines. It is noted that the memory cell 501a can include additional metal layers and/or dielectric layers over the M3 layer. It is also noted that the layer number and number of layers of the metals and vias described above are mere examples. One of ordinary skill in the art can modify them to achieve a desired routing of the memory circuit.

Figure 6:
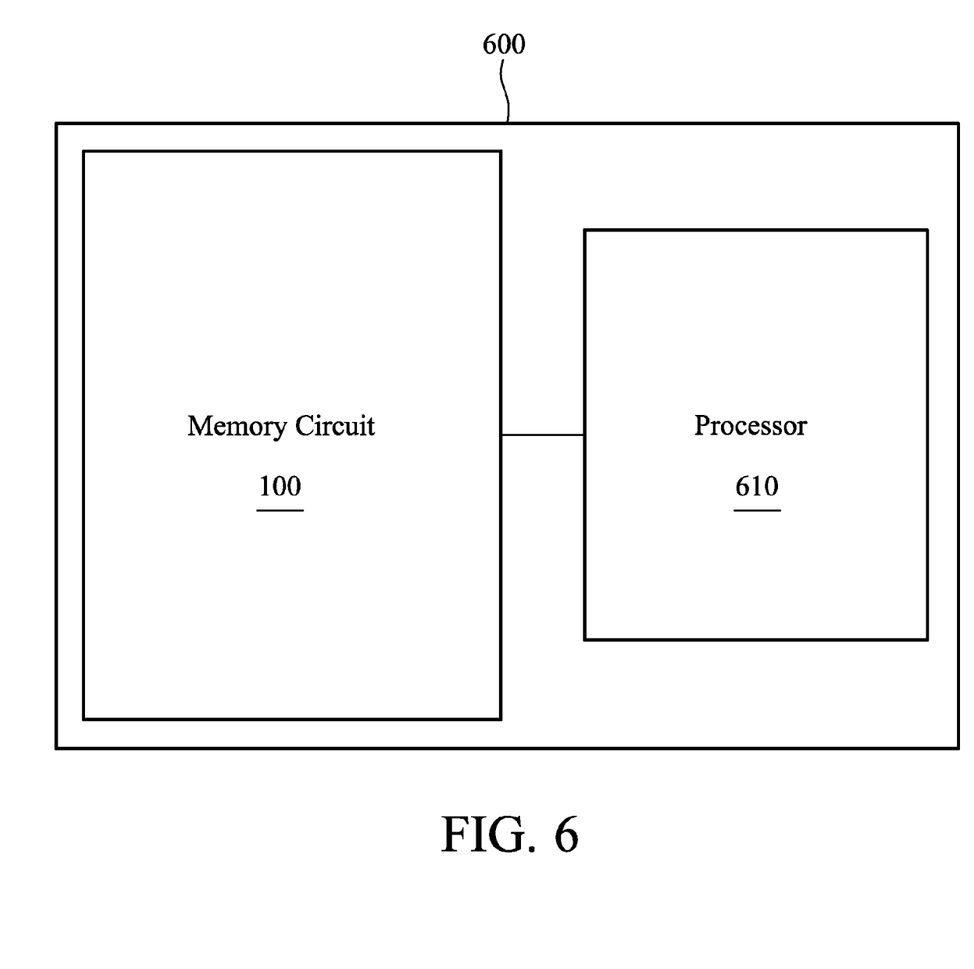
FIG. 6 is a schematic drawing showing a system including an exemplary memory circuit.

FIG. 6 is a schematic drawing showing a system including an exemplary memory circuit. In FIG. 6, a system 600 can include a processor 610 coupled with the memory circuit 100. The processor 610 is capable of accessing the datum stored in the memory cell 101a (shown in FIG. 1) of the memory circuit 100. In one or more embodiments, the processor 610 can be a processing unit, central processing unit, digital signal processor, or other processor that is suitable for accessing data of memory circuit.

In one or more embodiments, the processor 610 and the memory circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In one or more embodiments, the system 600 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those ordinarily skilled in the art may better understand the aspects of the present disclosure. Those ordinarily skilled in the art should appreciate that they may readily use the present disclosure as a basis for designing or modifying other processes and structures for carrying out the same or similar purposes and/or achieving the same or similar advantages of the embodiments introduced herein. Those ordinarily skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   at least one memory cell for storing a datum, the memory cell being coupled with a word line, a bit line, a bit line bar, a first voltage line, and a second voltage line; and
   a first conductive layer, a second conductive layer, and a third conductive layer arranged at different levels and being routed to define the word line, the bit line, the bit line bar, the first voltage line, and the second voltage line;
   wherein
   the second conductive layer is electrically coupled with the first conductive layer;
   the third conductive layer is electrically coupled with the second conductive layer;
   the third conductive layer is routed for the word line and is free from including the bit line, the bit line bar, the first voltage line, and the second voltage line within the memory cell;
   within the memory cell, the memory circuit is free from including a conductive part co-elevational with the third conductive layer; and
   a width of the third conductive layer for the word line within the memory cell is 50% or more of a width of a short side of the memory cell.

2. The memory circuit of claim 1, wherein the second conductive layer is routed for the bit line, the bit line bar, the first voltage line, and the second voltage line, and the second conductive layer is over the first conductive layer.

3. The memory circuit of claim 2, wherein the bit line is disposed between the first voltage line and the second voltage line.

4. The memory circuit of claim 2, wherein the second voltage line is disposed between the bit line and the first voltage line.

5. The memory circuit of claim 1, wherein the first voltage line is a Vdd line and the second voltage line is a Vss line, and the word line is substantially orthogonal to the Vss line.

6. The memory circuit of claim 1, wherein the first conductive layer is routed for the bit line and the bit line bar, the second conductive layer is over the first conductive layer, the second conductive layer is routed for the first voltage line and the second voltage line, and the third conductive layer is over the second conductive layer.

7. The memory circuit of claim 1, wherein a length of the long side of the memory cell is at least 2.5 times greater than the width of the short side of the memory cell.

8. The memory circuit of claim 1, wherein a length of the word line is at least 2.5 times greater than the length of the bit line.

9. A memory circuit, comprising:
   at least one memory cell for storing a datum, the memory cell being coupled with a word line, a bit line, a bit line bar, a first voltage line, and a second voltage line;
   a first metal layer;
   a second metal layer electrically coupled with the first metal layer, the second metal layer being routed for the first voltage line and the second voltage line; and
   a third metal layer electrically coupled with the second metal layer, the third metal layer being routed for the word line within the memory cell, wherein the third metal layer is over the second metal layer;
   wherein, within the memory cell, the memory circuit is free from including a metal part co-elevational with the third metal layer, and
   a width of the third metal layer for the word line within the memory cell is about 50% or more of a width of a short side of the memory cell.

10. The memory circuit of claim 9, wherein the second metal layer is further routed for the bit line and the bit line bar.

11. The memory circuit of claim 9, wherein the first voltage line is a Vdd line and the second voltage line is a Vss line, and the word line is substantially orthogonal to the Vss line.

12. The memory circuit of claim 9, wherein the first metal layer is routed for the bit line and the bit line bar and the first metal layer is below the second metal layer.

13. The memory circuit of claim 9, wherein a length of the long side of the memory cell is at least 2.5 times greater than the width of the short side of the memory cell.

14. A memory circuit, comprising:
   at least one memory cell for storing a datum, the memory cell being coupled with a word line, a bit line, a bit line bar, a first voltage line, and a second voltage line;
   a first metal layer defining electrical connections within the memory cell;
   a second metal layer electrically coupled with the first metal layer; and
   a third metal layer electrically coupled with the second metal layer, wherein the third metal layer routed for the word line within the memory cell has a width of 50% or more of a width of a short side of the memory cell.

15. The memory circuit of claim 14, wherein the second metal layer is routed for the first voltage line and the second voltage line, and the second metal layer is below the third metal layer.

16. The memory circuit of claim 15, wherein the second metal layer is further routed for the bit line and the bit line bar.

17. The memory circuit of claim 15, wherein the first voltage line is a Vdd line and the second voltage line is a Vss line, and the word line is substantially orthogonal to the Vss line.

18. The memory circuit of claim 15, wherein the first metal layer is routed for the bit line and the bit line bar and the first metal layer is below the second metal layer.

19. The memory circuit of claim 9, wherein the third metal layer routed for the word line is free from including the bit line, the bit line bar, the first voltage line, and the second voltage line within the memory cell.

20. The memory circuit of claim 19, wherein
the first metal layer defines electrical connections within the memory cell; and
the second metal layer is over the first metal layer.

* * * * *